(12) United States Patent
Hamdan et al.

(10) Patent No.: US 6,862,504 B2
(45) Date of Patent: Mar. 1, 2005

(54) SYSTEM AND METHOD FOR DETECTING ALTERNATOR CONDITION

(75) Inventors: Marv M. Hamdan, North Olmsted, OH (US); Gusztav Holler, Elyria, OH (US); Kenneth A. Grolle, Elyria, OH (US); Joseph M. Macnamara, Ashland, OH (US); Kirit A. Thakkar, Parma, OH (US)

(73) Assignee: Bendix Commercial Vehicle Systems LLC

( * ) Notice: Subject to any disclaimer, the term of this patent is extended or adjusted under 35 U.S.C. 154(b) by 0 days.

(21) Appl. No.: 10/238,543

(22) Filed: Sep. 10, 2002

(65) Prior Publication Data

US 2004/0049361 A1 Mar. 11, 2004

(51) Int. Cl.$^7$ .......................... G01R 31/02; H02J 7/14
(52) U.S. Cl. ........................................ 701/29; 320/104
(58) Field of Search .................... 701/29, 31; 324/426, 324/429, 772; 702/115; 307/9.1; 320/104; 324/433; 101/29, 31

(56) References Cited

U.S. PATENT DOCUMENTS

| | | |
|---|---|---|
| 4,314,193 A | 2/1982 | Mortonson |
| 4,315,204 A | 2/1982 | Sievers et al. |
| 4,348,629 A | 9/1982 | Sievers |
| 4,471,308 A | 9/1984 | Gable et al. |
| 4,613,808 A | 9/1986 | Edwards |
| 4,752,751 A | 6/1988 | Walker |
| 4,839,575 A | 6/1989 | MacFarlane |
| 5,281,919 A | 1/1994 | Palanisamy |
| 5,389,870 A | 2/1995 | Falater |
| 5,583,413 A | 12/1996 | Proctor et al. |
| 5,703,472 A | 12/1997 | Aoyama et al. |
| 5,780,995 A | 7/1998 | Maggioni et al. |
| 5,982,154 A | 11/1999 | Kanazawa et al. |
| 5,982,155 A | 11/1999 | Rechdan et al. |
| 5,986,439 A | 11/1999 | Pletta et al. |
| 6,018,234 A | 1/2000 | de Savasse |
| 6,064,186 A | 5/2000 | Pierret et al. |
| 6,081,103 A | 6/2000 | Pierret |
| 6,114,952 A * | 9/2000 | Francesangeli et al. ...... 340/453 |
| 6,275,161 B1 * | 8/2001 | Wan et al. .................... 340/636 |
| 6,339,742 B2 * | 1/2002 | Weisman, II ................ 701/114 |
| 6,363,303 B1 | 3/2002 | Bertness |
| 6,445,158 B1 * | 9/2002 | Bertness et al. ............. 320/104 |
| RE38,100 E * | 4/2003 | Rentsch et al. .............. 324/166 |
| 2001/0054890 A1 | 12/2001 | Thibedeau et al. |
| 2002/0011829 A1 | 1/2002 | Thibedeau et al. |

FOREIGN PATENT DOCUMENTS

| | | | | |
|---|---|---|---|---|
| JP | 63124965 A | * | 5/1988 | ......... G01R/19/165 |
| JP | 1135136 A | * | 5/1989 | ............ H04B/7/26 |

* cited by examiner

*Primary Examiner*—Marc S. Hoff
*Assistant Examiner*—Paul Kim
(74) *Attorney, Agent, or Firm*—Calfee, Halter & Griswold LLP

(57) ABSTRACT

A system and method for detecting alternator condition is provided. Information is taken from the vehicle powerline and the communication links, and processed by the vehicle ECU, such as the vehicle antilocking brake system ECU, to obtain data. The battery voltage ripple amplitude is then calculated and compared at different engine speeds. If the difference in the ripple amplitude at the different engine speeds is greater than a predetermined threshold value, a signal is sent indicating that the alternator has failed.

11 Claims, 3 Drawing Sheets

SYSTEM AND METHOD FOR DETECTING ALTERNATOR CONDITION

TECHNICAL FIELD OF THE INVENTION

This invention relates to a system and method for detecting alternator conditions, and more specifically, to a system and method of detecting alternator conditions using an electrical control unit (ECU) to process measurements of the vehicle battery.

BACKGROUND OF THE INVENTION

A vehicle's alternator is essential to the vehicle's operation. The failure of the alternator can cause significant problems, especially in the labor, down time, and material replacement expenses. Adding to the cost is the expense of towing or repairing the vehicle when a breakdown occurs out in the field. Also, depending on the cargo, late delivery, or damage, can result in significant monetary loss. Early detection of the alternator's impending failure would be helpful in allowing repair and/or replacement of a faulty alternator before the alternator fails when the vehicle is in the field. Early detection is usually possible since alternator failure is typically not a sudden event.

Known methods for detecting alternator condition include the measurement of the voltage from the alternator. Such methods may include detecting the frequency of the waveform generated by the alternator and comparing it to a threshold value, or comparing the absolute voltage measurement to a standardized threshold voltage. However, such methods have proven to be ineffective and difficult to implement. Many of the tools on the market require the vehicle to be stationary and are typically used in the maintenance garage. Frequently the detection of alternator failure is too late, or after the fact. The traditional method of measuring the condition of an alternator includes disassembly of the alternator and testing the individual diodes. This method is not cost effective and does not provide a continuous monitoring system of the alternator condition.

Accordingly, a need exists for a system and method for monitoring the condition of an alternator, wherein reliable data can be obtained in a cost-effective, real time manner.

BRIEF SUMMARY OF THE INVENTION

A system and method for detecting alternator condition is provided. Voltage data is taken from a power supply system and manipulated to determine whether or not the alternator is functioning properly. In one embodiment, voltage data is taken over a predetermined period of time and sent to the vehicle ECU. In one specific embodiment, the ECU is the antilocking brake system ECU. The system voltage is measured at different engine speeds and the difference between the ripple amplitude at the different engine speeds is compared to determine the condition of the alternator.

Another aspect of the present invention is a system for determining alternator condition. In one embodiment, the system includes the alternator, a battery, an ECU and one or more communication buses. The communication buses are used to determine relevant parameters such as engine speed, and also to transmit the status of the alternator condition. In one specific embodiment, the ECU is the vehicle antilocking brake system ECU and the communication bus is either the J1587 Diagnostic, J2497 PLC Communications, or J1939 Controller Area Network buses.

DETAILED DESCRIPTION

Figure 1:
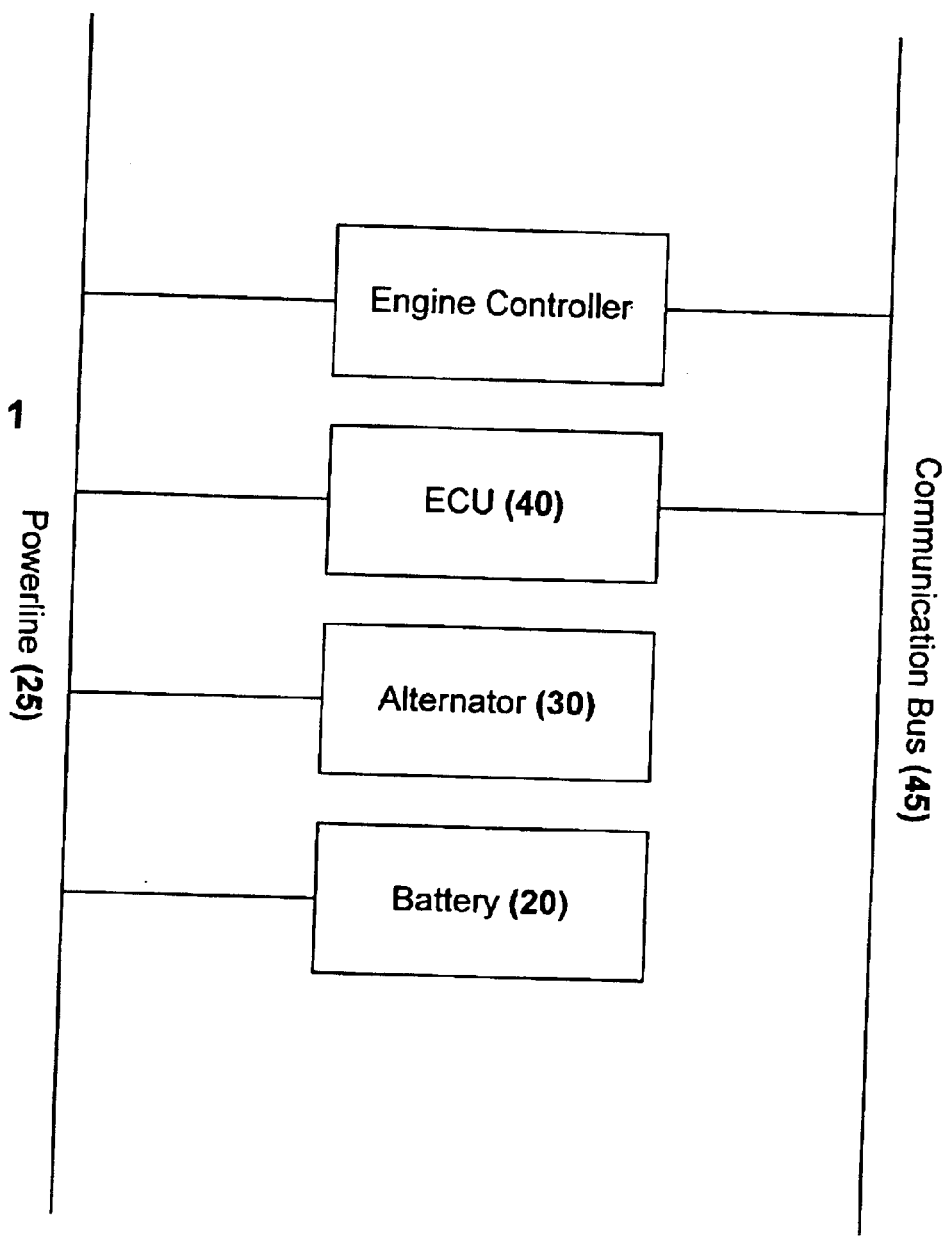
FIG. 1 is a schematic of a typical electrical system for a vehicle, incorporating the present invention.

FIG. 1 illustrates a typical electrical system of a vehicle, such as, for example, a commercial vehicle, generally designated by reference number 10. The principal components of this system 10 are the battery 20, powerline 25, alternator 30 vehicle ECU 40, and communications bus 45. It should be noted by one skilled in the art that the battery voltage is the voltage measured across the powerline 25. While the embodiment discussed in this application is generally directed to the use of the vehicle antilocking brake system (ABS) ECU, it should be appreciated that a different or separate ECU can be used, or a separate circuit, and therefore is covered within the scope of this application. The battery 20 and alternator 30 and ECU 40 are all connected to the same powerline 25 which provides information to the vehicle ECU 40. Such information can be transferred to the vehicle ECU 40 by one or more electrical buses 45. The communication bus 45 can be a pre-existing vehicle bus, such as, for example, the J1587, J2497 or J1939 buses, or can be a new bus installed on the vehicle for the detection of the alternator condition, or other purposes, such as measurement of engine speed. The J1587 link is the commonly used diagnostic bus for installed electronic controllers. The J1939 link is used for engine to transmission communication.

The analog voltage from the vehicle battery 20 can be measured at appropriate intervals and processed into a digital sample voltage data U by an A/D converter. The sample voltage data U can then be used in connection with engine RPM data obtained from communication link 45. This information is inputted into an alternator condition determining algorithm, such as the one disclosed in this application, to determine the condition of the alternator. Additionally, if the algorithm detects a faulty or partially faulty alternator, the vehicle ECU 40 can send a signal to the operator indicating the failure or partial failure of the alternator 30. For example, the signal can be sent to the vehicle cabin in the form of an audio signal or a visual signal, or it can be processed into a display that provides a diagnosis on one or more parts of the vehicle. Operator warning can also be provided by the vehicle communication bus 45.

Figure 2:
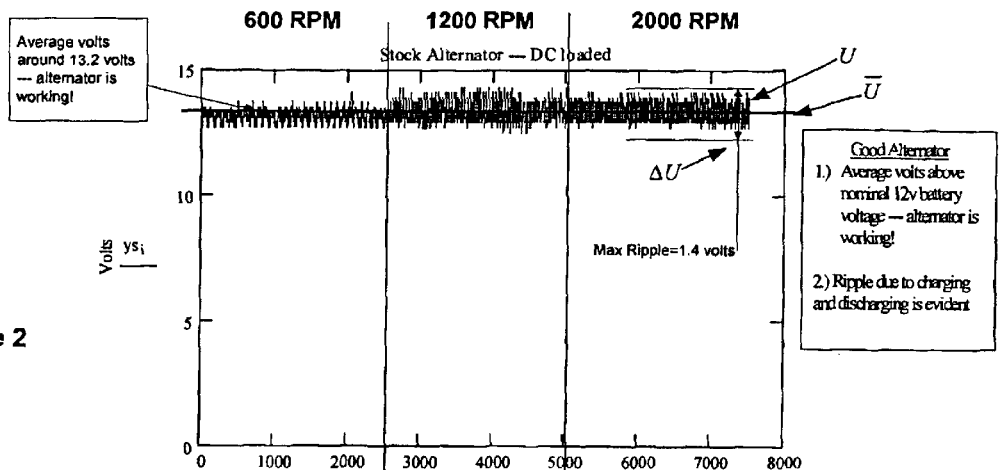
FIG. 2 is a graph plotting battery voltage versus engine speed for a good alternator.

The method for determining the condition of an alternator 30 is based on measurements of the electrical system voltage from the powerline 25 at specified engine RPM values. As shown in FIG. 2, as the battery voltage U is measured over a range of engine speeds, the data provides for a fairly uniform measurement about the average battery voltage $\overline{U}$. However, the measured signal is DC value with a ripple component having a ripple amplitude $\Delta U$, a maximum voltage $U_{max}$, and a minimum voltage $U_{min}$, that oscillates about the average battery voltage $\overline{U}$. For example, as shown in FIG. 2, a typical 12V battery with an alternator in good condition will produce a signal with an average battery voltage $\overline{U}$ of 13.2 volts. The ripple amplitude $\Delta U$ in such conditions will be nominal, such that the maximum ripple, the difference between $U_{max}$ and $U_{min}$ (or $\Delta U_{max}$), will be less than 2 volts.

Figure 3A:
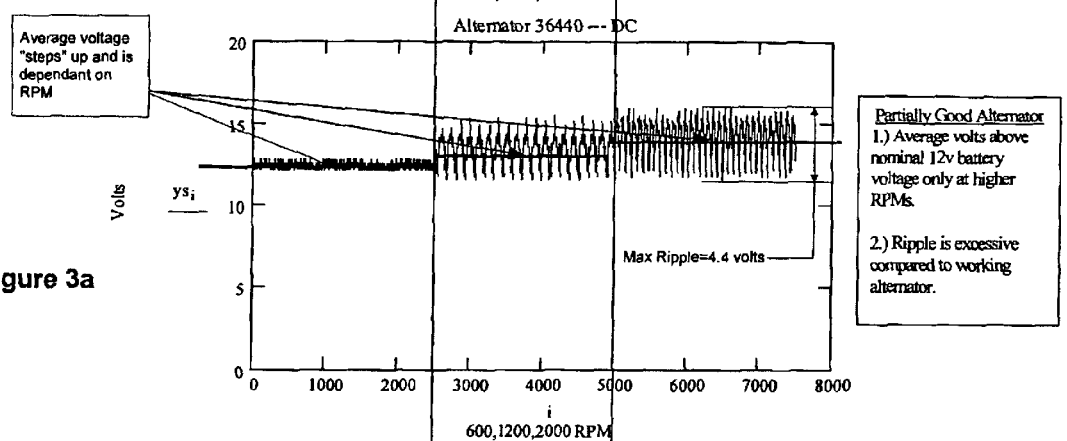
FIG. 3a is a graph plotting battery voltage versus engine speed for a partially faulty alternator.

As shown in FIG. 3a, the average battery voltage $\overline{U}$ and the ripple amplitude $\Delta U$ increase with increasing engine revolutions per minute (RPM) for a partially good alternator.

Figure 3B:
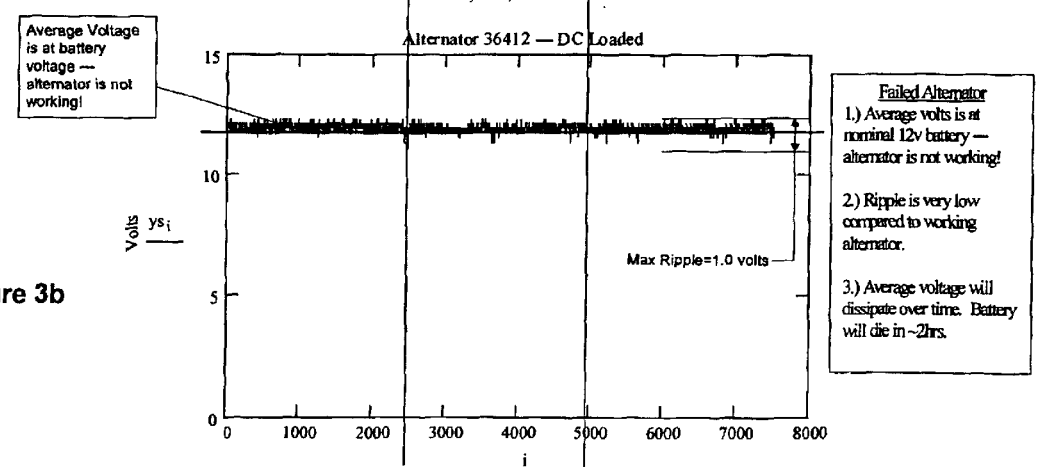
FIG. 3b is a graph plotting battery voltage versus engine speed for a bad alternator.

For a specific case, as shown in FIG. 3a, the change in ΔU at high engine RPM compared to at idle engine RPM is approximately 4.4 volts. However, the change in ΔU is dependent on the nature of the failure. As such, a partial failure of a vehicle's alternator is best detected when the difference in the ΔU at mid-range engine RPM (approximately 1,000–1,500) and at idle engine RPM (approximately 500–900) is less than two times ΔU at idle engine RPM. It should be appreciated by one skilled in the art that the data above has been produced using specific engines, alternators, and batteries (12V, 24V, etc) that are typical of the industry; however data that varies from these calculations due to differences in the equipment used can still be used to determine alternator condition under a different set of indicating parameters. As shown in FIG. 3b, a failed alternator has an average battery voltage $\overline{U}$ approximately equal to the battery voltage, i.e. approximately 12V, and does not increase with increasing engine RPM. As the system 10 continues to operate, the battery will begin to have voltage readings below 12V. The average battery voltage $\overline{U}$ will continue to dissipate over time and the battery will die in a relatively short amount of time. Depending on the nature of alternator failure, the battery composition, and the time failure was first detected, this time may range from several minutes to a couple hours.

Figure 4:
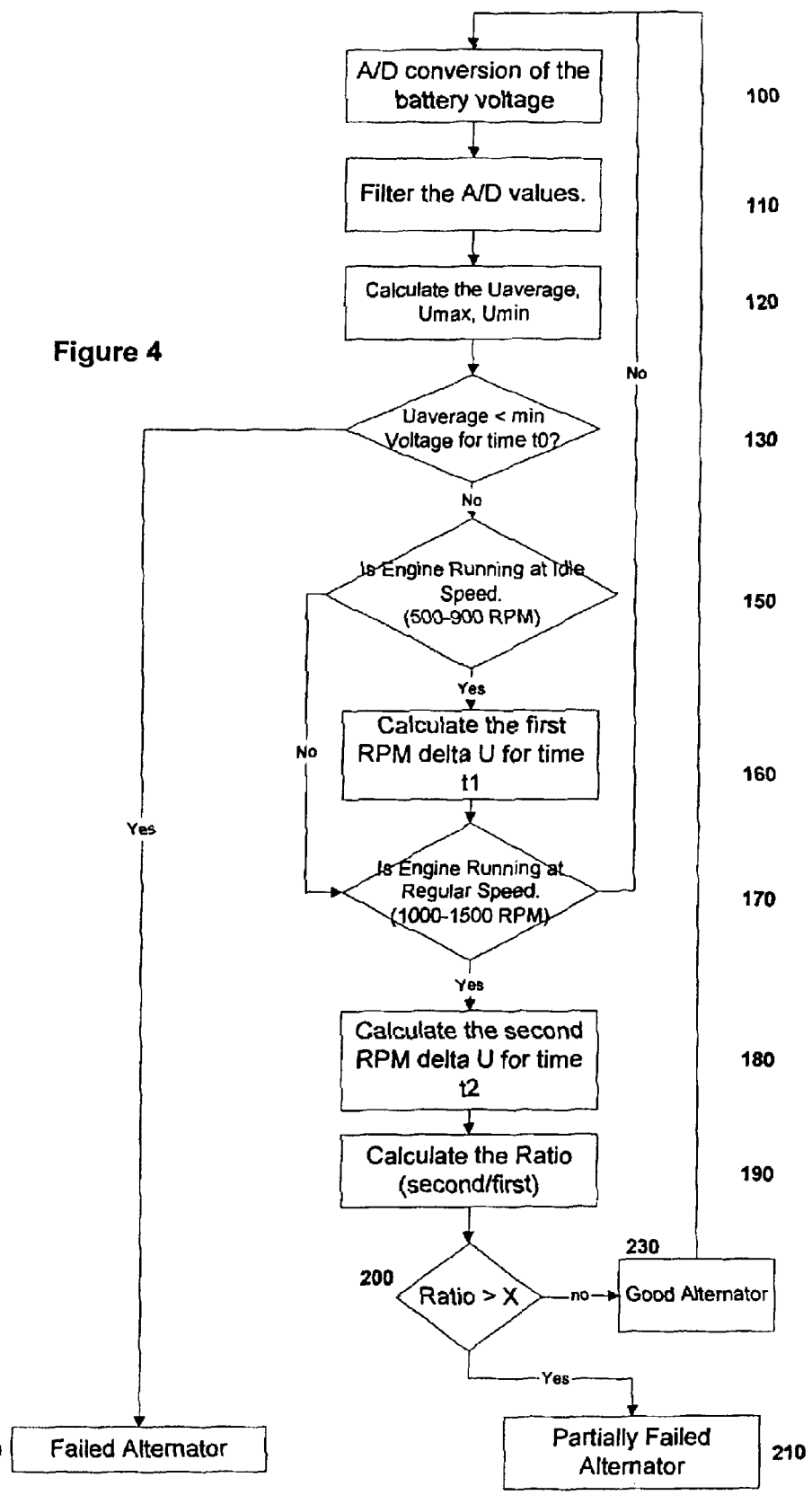
FIG. 4 is a flow diagram of an alternator condition detection algorithm.

As an illustrative example, the algorithm for monitoring and detecting alternator failure can include the following steps. Such an illustrative algorithm is shown in FIG. 4. In step 100, the ABS ECU samples the powerline voltage. In this embodiment, 20 KHZ was determined a sufficient sampling rate. In optional step 110, data can be filtered or weighted to accommodate for changes in battery loads, PLC Communications, or other conditions that may skew the data. For example, the ECU can look for idle line of the PLC before using the data gathered. In step 120, the ECU then determines the average battery voltage $\overline{U}$, the ripple amplitude ΔU, the maximum battery voltage $U_{max}$ and the minimum battery voltage $U_{min}$ during a sample period. Optionally, the ECU can clear these values and obtain a new sample set for a given period of time, every ten seconds, for example.

In step 130, the ECU determines if $\overline{U}$ is below a predetermined threshold value, preferably approximately 12V. If the ECU determines that average battery voltage $\overline{U}$ is less than the threshold value for a predetermined time interval, the ECU proceeds to step 140 wherein a signal is sent to indicate the alternator failure. If the ECU determines that average battery voltage $\overline{U}$ is not less than the threshold value, the ECU then proceeds to step 150 wherein the ECU processes the data related to the engine speed (in RPM). The ECU can receive this signal from the J1939, or J1587 vehicle data buses, or from some other data bus. In step 150, the ECU determines if the data collected was at a different engine RPM than the previous data (or if the data was the first data set). In Step 180, the data set is taken at a different engine speeds. A different engine speed is a predetermined difference, wherein the difference is great enough to provide practical data. In the preferred embodiment, the different engine speeds that should be measured should fall into each of one of the idle engine speed (500–900 RPM) and a midrange engine speed (1,000–1,500 RPM).

If at step 190, the ECU detects two different engine speed data sets, the ECU determines $\Delta U_{ratio}$ calculated from ripple amplitude ΔU at the second engine RPM (preferably midrange engine speed) divided by the ripple amplitude ΔU at the first engine RPM (preferably idle engine speed). At step 200, the ECU determines if the $\Delta U_{ratio}$ is greater than a certain threshold. If $\Delta U_{ratio}$ is greater than that value, then the ECU signals a partial alternator failure, at step 210, and then starts taking samples again at step 100. Additionally, more than 2 engine RPM values can be measured, or a linear equation could be used to obtain $\Delta U_{ratio}$ for any given RPM. Optionally, the ECU can store the alternator data and produce a partial alternator signal after processing a given number of alternator failing $\Delta U_{ratio}$ readings. If $\Delta U_{ratio}$ is not greater than approximately 2, the algorithm loops back to step 100 and starts to take new data. Optionally, the ECU can send a signal to indicate a good alternator at step 230.

It will be appreciated that the system for determining alternator condition may adopt a wide variety of configurations and the method for determining alternator condition may take into account a number of variations, including additional variables. This invention is intended to include such modifications and alterations in so far as they fall within the scope of the appended claims or the equivalents thereof.

What is claimed is:

1. A method of detecting alternator condition on a commercial vehicle comprising the steps of:
    sampling powerline voltage from the commercial vehicle battery in predetermined intervals;
    calculating an average voltage, a maximum voltage, a minimum voltage, and a differential voltage;
    detecting the engine speed; and
    changing engine speed to a second engine speed;
    calculating an average voltage, a maximum voltage, a minimum voltage and a differential voltage at said second engine speed;
    calculating a ratio of the differential voltage at the higher of said first and second engine speeds to the lower of said first and second engine speeds; and
    comparing said ratio to a predetermined standard to determine the alternator condition.

2. The method of claim 1, further comprising the step of sending a signal indicating alternator condition.

3. The method of claim 2, wherein the signal is sent to one or more alternator condition indicators within the cab of the commercial vehicle.

4. The method of claim 1, further comprising the step of filtering the battery voltage data.

5. The method of claim 1, further comprising the steps of comparing the average battery voltage to a predetermined threshold value and sending a signal indicating alternator failure if the average voltage is less than the predetermined threshold value.

6. The method of claim 1, wherein the step of sending a signal indicating alternator condition further comprises the step of indicating a partially failed alternator when the differential battery voltage at a first engine speed is more than approximately 2 times the differential battery voltage at a second engine speed.

7. The method of claim 1, wherein each of the calculating steps is carried out by a vehicle antilocking braking system ECU.

8. The method of claim 1, wherein the first engine speed is in the range of approximately 1,000 to approximately 1,500 RPM.

9. The method of claim 1, wherein the second engine speed is in the range of approximately 500 to approximately 900 RPM.

10. The method of claim 1, further comprising the step of providing a warning to an operator of said vehicle when the alternator has failed.

11. The method of claim 10, wherein the warning provided to the operator is an audio or visual warning that cm be sensed from within a vehicle cabin.

* * * * *